(12) United States Patent
Danner et al.

(10) Patent No.: US 7,880,655 B2
(45) Date of Patent: Feb. 1, 2011

(54) SYSTEM, IN PARTICULAR FOR DIGITIZING A TIME-CONTINUOUS AND VALUE-CONTINUOUS PERIODIC SIGNAL WITH A FIRMLY PREDEFINED NUMBER OF SAMPLES PER PERIOD

(75) Inventors: Andreas Danner, Nürnberg (DE); Thomas Fleischmann, Röthenbach (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 12/458,934

(22) Filed: Jul. 28, 2009

(65) Prior Publication Data

US 2010/0033361 A1    Feb. 11, 2010

(30) Foreign Application Priority Data

Jul. 29, 2008   (EP) ................... 08075672

(51) Int. Cl.
*H03M 3/00* (2006.01)
(52) U.S. Cl. ...................... 341/143; 341/155
(58) Field of Classification Search ............. 341/143, 341/155, 111, 122, 123
See application file for complete search history.

(56) References Cited

U.S. PATENT DOCUMENTS

| | | | | |
|---|---|---|---|---|
| 5,914,991 | A * | 6/1999 | Gigandet et al. | 375/355 |
| 6,157,329 | A * | 12/2000 | Lee et al. | 341/133 |
| 6,901,146 | B1 * | 5/2005 | Taura et al. | 381/3 |
| 7,061,276 | B2 * | 6/2006 | Xu | 327/2 |
| 7,099,642 | B2 * | 8/2006 | Fernandez-Corbaton et al. | 455/255 |
| 7,142,063 | B2 * | 11/2006 | Grewing et al. | 331/16 |
| 2006/0103555 | A1 | 5/2006 | Antonesei | |

FOREIGN PATENT DOCUMENTS

| | | |
|---|---|---|
| EP | 08 458 865 A2 | 6/1998 |
| GB | 2 255 681 A | 11/1992 |
| WO | WO 03/065590 A2 | 8/2003 |

\* cited by examiner

*Primary Examiner*—Peguy JeanPierre
(74) *Attorney, Agent, or Firm*—Harness, Dickey & Pierce, P.L.C.

(57) ABSTRACT

A system is disclosed, in particular for digitizing a time-continuous and value-continuous periodic signal with a respective firmly predefined number of samples per period. In at least one embodiment, the system includes an A/D converter for digitizing an analog AC signal applied to the input of the A/D converter, the converter including a single-bit modulator which converts the AC signal into a first data stream of temporally immediately successive single-bit data words at a predefined operating clock rate; and a downstream decimation filter which respectively aggregates a predefined number of temporally immediately successive single-bit data words in the first data stream into respective temporally immediately successive n-bit data words which form a second data stream which corresponds to a digitization of the AC signal at a sampling frequency which is derived from the operating clock rate and the predefined number by way of division. In order to achieve digitization with a respective firmly predefined number of samples per period with relatively little technical complexity, it is proposed in at least one embodiment that the operating clock rate be respectively generated by a digitally adjustable oscillator on the basis of a signal characteristic of the AC signal.

15 Claims, 1 Drawing Sheet

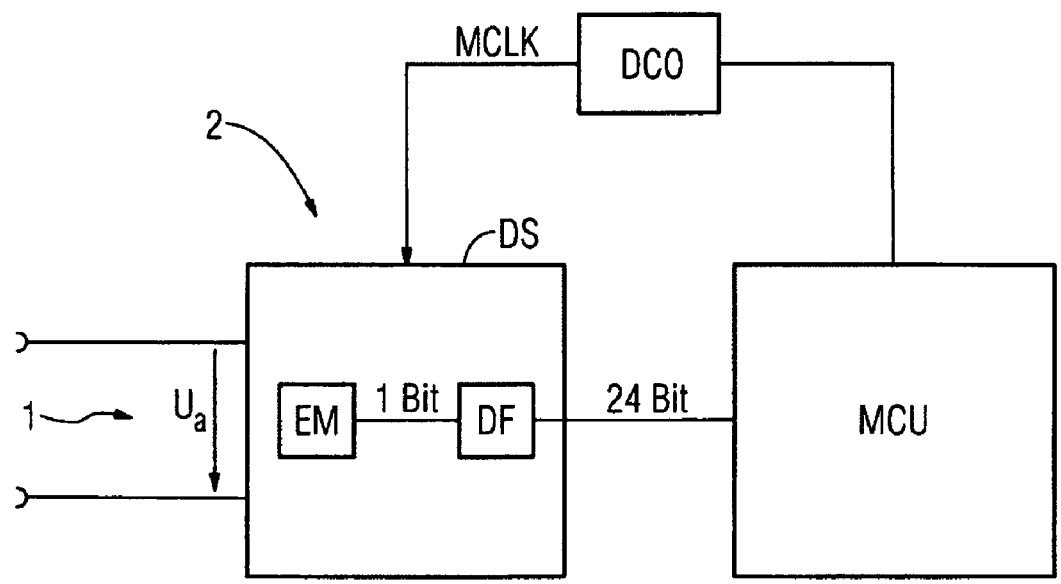

SYSTEM, IN PARTICULAR FOR DIGITIZING A TIME-CONTINUOUS AND VALUE-CONTINUOUS PERIODIC SIGNAL WITH A FIRMLY PREDEFINED NUMBER OF SAMPLES PER PERIOD

PRIORITY STATEMENT

The present application hereby claims priority under 35 U.S.C. §119 on European patent application number EP08075672 filed Jul. 29, 2008, the entire contents of which are hereby incorporated herein by reference.

FIELD

At least one embodiment of the invention generally relates to a system, in particular for digitizing a time-continuous and value-continuous periodic signal with a respective firmly predefined number of samples per period.

BACKGROUND

The digitization of analog AC voltages using A/D converters is generally known. A special A/D converter which is often used is the so-called delta-sigma converter which makes it possible to rapidly digitize an analog AC signal with a high resolution of 24 bits, for example. The data stream (of the 24-bit data words) generated by a delta-sigma converter is generated in this case at a firmly predefined operating clock rate applied from the outside. The operating clock rate is greater than the highest frequency to be resolved in the input signal by at least the oversampling factor; if said frequency is 100 kHz, an operating clock rate of 2.56 MHz is expedient for an oversampling factor of 256.

If an FFT (Fast Fourier Transformation) is intended to be calculated for a digitized AC voltage, a fixed number of sampling points per period is required for each period of the AC voltage, preferably $2^n$ sampling points per period, where n is a positive integer, the FFT being calculated over a multiplicity of periods which form the so-called measuring period over which the fundamental frequency of the AC signal is substantially constant.

If the fundamental frequency of the AC signal changes, the fixed operating clock rate of the output current of the delta-sigma converter must be converted into a data stream having the desired fixed number of sampling points per period, for example by means of interpolation. This is computation-intensive and relatively complicated.

Alternatively, however, use may also be made of successive approximation A/D converters which are relatively expensive and whose accuracy is limited.

SUMMARY

In at least one embodiment of the invention, a time-continuous and value-continuous periodic signal is digitized with a respective firmly predefined number of samples per period with relatively little technical complexity.

In a solution of at least one embodiment, the operating clock rate is respectively generated by a digitally adjustable oscillator on the basis of a signal characteristic of the AC signal. At least one embodiment of the invention is based on the fundamental idea of controlling the output signal from the oscillator using a signal characteristic of the AC signal. Control is effected in such a manner that a digital number corresponding to the operating clock rate is applied to the input of the oscillator, the number thus corresponding to the output frequency to be generated by the oscillator and depending on a signal characteristic of the AC signal.

The number of sampling points per period is considerably greater and the interval of time between two sampling points is greatly reduced as a result of the oversampling of the A/D converter. The error made if the sampling points are not symmetrical within a period, that is to say if the interval between the first sampling point and the zero crossing at the start of the period is not equal to the interval of time between two sampling points, is analogous. In practice, this temporal error is also reduced by multiplying the number of sampling points per period by a number which is usually even greater than 1000, in addition to the oversampling factor, in order to also detect higher frequency components (for example the 512th harmonic).

The second data stream is advantageously used to respectively determine the fundamental frequency as signal characteristics of the AC signal, and the frequency of the digitally adjustable oscillator and the sampling frequency derived therefrom are set to a multiple of the fundamental frequency, in particular an integer multiple.

It is technically simple if the fundamental frequency is determined with the aid of a digital signal processor (DSP) or a digital microcontroller (Micro Control Unit MCU), and the oscillator is digitally adjusted by the signal processor or microcontroller. The signal processor or microcontroller thus not only sets the fundamental frequency to be generated by the oscillator but also itself determines said fundamental frequency using the data stream available at the output of the A/D converter.

In order to increase the accuracy during subsequent processing of the second data stream as an image of the digitized AC signal, in particular in order to calculate the FFT, it is proposed that the sampling frequency be respectively set using the frequency of the digitally adjustable oscillator in such a manner that the number of sampling points per period duration of the fundamental frequency is constant.

The subsequent processing can be simplified further if the number of sampling points per period duration of the fundamental frequency is a power of two ($2^n$ or 2 to the power of an integer n).

In order to increase the accuracy of the information determined from the digitized AC signal, it is proposed that the fundamental frequency determined be used to define a temporal measuring period (for example based on PMD for determination of the r.m.s. value).

The measuring period is expediently an integer multiple of the instantaneous fundamental frequency determined.

The FFT is advantageously carried out over the measuring period.

BRIEF DESCRIPTION OF THE DRAWINGS

The invention is described in more detail below using an example embodiment.

The single FIGURE shows a system for digitizing an analog AC voltage Ua as an example of an analog AC signal 1.

DETAILED DESCRIPTION OF THE EXAMPLE EMBODIMENTS

Various example embodiments will now be described more fully with reference to the accompanying drawings in which only some example embodiments are shown. Specific structural and functional details disclosed herein are merely representative for purposes of describing example embodiments. The present invention, however, may be embodied in many alternate forms and should not be construed as limited to only the example embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the present invention to the particular forms disclosed. On the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, term such as "below" can encompass both an orientation of above and below. The device may be otherwise oriented (rotated 90 degrees or at other orientations) and the spatially relative descriptors used herein are interpreted accordingly.

Although the terms first, second, etc. may be used herein to describe various elements, components, regions, layers and/or sections, it should be understood that these elements, components, regions, layers and/or sections should not be limited by these terms. These terms are used only to distinguish one element, component, region, layer, or section from another region, layer, or section. Thus, a first element, component, region, layer, or section discussed below could be termed a second element, component, region, layer, or section without departing from the teachings of the present invention.

The AC voltage Ua with a fundamental frequency of 50 Hz is applied to the input of an A/D converter 2 which is in the form of a delta-sigma converter DS. The fundamental frequency fluctuates over time between 45 Hz and 65 Hz, changes in the fundamental frequency taking place relatively slowly, that is to say over a number of periods of the AC voltage Ua.

The A/D converter 2 comprises a single-bit modulator which converts the AC voltage Ua into a data stream (first data stream) of temporally immediately successive single-bit data words at an operating clock rate MCLK of 2.6 MHz. A downstream decimation filter DF converts the data stream of immediately successive single-bit data words into temporally immediately successive 24-bit data words, that is to say into data words with a length of 24 bits, a 24-bit data word respectively being aggregated from 256 single-bit data words, which corresponds to an oversampling factor of 256. If the operating clock rate of 2.56 MHz is divided by the number of aggregated data words (256 in this case), 100 kHz is obtained here as the largest sampling frequency of the AC voltage Ua.

The A/D converter 2 is connected to a digital microcontroller (Micro Control Unit) MCU which evaluates the output data stream (second data stream) of the A/D converter 2. During the evaluation, the fundamental frequency of the analog AC voltage Ua is determined as the essential signal characteristic of the analog AC voltage Ua. It goes without saying that the functions of the digital microcontroller MCU can also be carried out by a digital signal processor and the like.

On the other hand, the microcontroller MCU sets the operating clock rate MCLK of the A/D converter 2 using a digitally adjustable oscillator DCO (Digital Control oscillator). The specification or setting is made digitally, that is to say in the form of a digital number which is applied to the input of the oscillator DCO. The operating clock rate MCLK is selected in such a manner that the sampling frequency of the second data stream of the A/D converter 2 is not only an integer multiple of the fundamental frequency but rather the number of sampling points per period duration of the fundamental frequency is a power of two in each case (2 to the power of an integer or $2^p$, where p is equal to an integer). This also means that the number of sampling points per period duration of the fundamental frequency is constant. This requirement can be ensured for a multiplicity of immediately successive periods of the AC voltage Ua if the fundamental frequency of the latter changes only slowly over time. In this case, an integer multiple of the period of the AC voltage Ua respectively forms a measuring period which can be used to calculate an FFT, for example in order to calculate the r.m.s. value of the AC voltage Ua or, in a derived manner, the alternating current.

Strictly speaking, the microcontroller MCU is in this case in the feedback loop which runs via the oscillator DCO.

The digitally adjustable oscillator DCO can alternatively also be in a DDS circuit (DDS-IC) which specifically carries out direct digital synthesis (DDS). A DDS circuit can be used to generate the operating clock rate MCLK in a very wide frequency range with a very high degree of accuracy, for example. A DDS circuit with an operating frequency of 75 MHz and a 28-bit setting register can generate an output signal which is in a range from 0 to 75/2 Hz. The setting accuracy is 75 MHz/$2^{28}$, that is approximately 0.279 Hz. If an oversampling factor of 256 is considered, the operating clock rate can be set with an accuracy of 0.279 Hz/256 anyway, that is to say approximately 0.001 Hz. In order to generate the operating clock rate MCLK for the A/D converter 2, a Schmitt trigger is also connected downstream of the DDS circuit.

The patent claims filed with the application are formulation proposals without prejudice for obtaining more extensive patent protection. The applicant reserves the right to claim even further combinations of features previously disclosed only in the description and/or drawings.

The example embodiment or each example embodiment should not be understood as a restriction of the invention. Rather, numerous variations and modifications are possible in the context of the present disclosure, in particular those variants and combinations which can be inferred by the person skilled in the art with regard to achieving the object for example by combination or modification of individual features or elements or method steps that are described in connection with the general or specific part of the description and are contained in the claims and/or the drawings, and, by way of combinable features, lead to a new subject matter or to new method steps or sequences of method steps, including insofar as they concern production, testing and operating methods.

References back that are used in dependent claims indicate the further embodiment of the subject matter of the main claim by way of the features of the respective dependent claim; they should not be understood as dispensing with obtaining independent protection of the subject matter for the combinations of features in the referred-back dependent claims. Furthermore, with regard to interpreting the claims, where a feature is concretized in more specific detail in a subordinate claim, it should be assumed that such a restriction is not present in the respective preceding claims.

Since the subject matter of the dependent claims in relation to the prior art on the priority date may form separate and independent inventions, the applicant reserves the right to make them the subject matter of independent claims or divisional declarations. They may furthermore also contain independent inventions which have a configuration that is independent of the subject matters of the preceding dependent claims.

Further, elements and/or features of different example embodiments may be combined with each other and/or substituted for each other within the scope of this disclosure and appended claims.

Still further, any one of the above-described and other example features of the present invention may be embodied in the form of an apparatus, method, system, computer program, computer readable medium and computer program product. For example, of the aforementioned methods may be embodied in the form of a system or device, including, but not limited to, any of the structure for performing the methodology illustrated in the drawings.

Even further, any of the aforementioned methods may be embodied in the form of a program. The program may be stored on a computer readable medium and is adapted to perform any one of the aforementioned methods when run on a computer device (a device including a processor). Thus, the storage medium or computer readable medium, is adapted to store information and is adapted to interact with a data processing facility or computer device to execute the program of any of the above mentioned embodiments and/or to perform the method of any of the above mentioned embodiments.

The computer readable medium or storage medium may be a built-in medium installed inside a computer device main body or a removable medium arranged so that it can be separated from the computer device main body. Examples of the built-in medium include, but are not limited to, rewriteable non-volatile memories, such as ROMs and flash memories, and hard disks. Examples of the removable medium include, but are not limited to, optical storage media such as CD-ROMs and DVDs; magneto-optical storage media, such as MOs; magnetism storage media, including but not limited to floppy disks (trademark), cassette tapes, and removable hard disks; media with a built-in rewriteable non-volatile memory, including but not limited to memory cards; and media with a built-in ROM, including but not limited to ROM cassettes; etc. Furthermore, various information regarding stored images, for example, property information, may be stored in any other form, or it may be provided in other ways.

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A system, comprising:
   an A/D converter to digitize an analog AC signal applied to an input of the A/D converter, said A/D converter comprising a single-bit modulator to convert the analog AC signal into a first data stream of temporally immediately successive single-bit data words at an operating clock rate;
   a downstream decimation filter to respectively aggregate a number of temporally immediately successive single-bit data words in the first data stream into respective temporally immediately successive n-bit data words which form a second data stream which corresponds to a digitization of the analog AC signal at a sampling frequency derived from the operating clock rate and the number of temporally immediately successive single-bit data words by way of division, the operating clock rate being respectively generated by a digitally adjustable oscillator on the basis of a signal characteristic of the analog AC signal.

2. The system as claimed in claim 1, wherein the second data stream is usable to respectively determine a fundamental frequency as a signal characteristic of the analog AC signal, and wherein a frequency of the digitally adjustable oscillator and the sampling frequency derived therefrom are set to a multiple of the fundamental frequency.

3. The system as claimed in claim 2, wherein the fundamental frequency is determined via a digital signal processor or a digital microcontroller, and the oscillator is digitally adjusted by the signal processor or microcontroller.

4. The system as claimed in claim 3, wherein the sampling frequency is respectively set using the frequency of the digitally adjustable oscillator in such a manner that the number of sampling points per period duration of the fundamental frequency is constant.

5. The system as claimed in claim 4, wherein the number of sampling points per period duration of the fundamental frequency is a power of two.

6. The system as claimed in claim 3, wherein the fundamental frequency determined is used to define a temporal measuring period.

7. The system as claimed in claim 6, wherein the temporal measuring period is an integer multiple of the respective instantaneous fundamental frequency determined.

8. The system as claimed in claim 3, wherein a respective FFT is carried out over the measuring period.

9. The system as claimed in claim 2, wherein the sampling frequency is respectively set using the frequency of the digitally adjustable oscillator in such a manner that the number of sampling points per period duration of the fundamental frequency is constant.

10. The system as claimed in claim 9, wherein the number of sampling points per period duration of the fundamental frequency is a power of two.

11. The system as claimed in claim 2, wherein the fundamental frequency determined is used to define a temporal measuring period.

12. The system as claimed in claim 11, wherein the temporal measuring period is an integer multiple of the respective instantaneous fundamental frequency determined.

13. The system as claimed in claim 2, wherein a respective FFT is carried out over the measuring period.

14. The system as claimed in claim 1, wherein the system is for digitizing a time-continuous and value-continuous periodic signal with a respective firmly predefined number of samples per period.

15. The system as claimed in claim 1, wherein the A/D converter is a delta-sigma converter.

* * * * *